US012579333B2

(12) United States Patent
Jaguwala

(10) Patent No.: US 12,579,333 B2
(45) Date of Patent: Mar. 17, 2026

(54) SYSTEM AND METHOD FOR ELECTRONIC DUPLICATION AND SIMULATION OF ENVIRONMENTS VIA A HARDWARE DEVICE NETWORK

(71) Applicant: BANK OF AMERICA CORPORATION, Charlotte, NC (US)

(72) Inventor: Bhavikkumar Jaguwala, Plano, TX (US)

(73) Assignee: BANK OF AMERICA CORPORATION, Charlotte, NC (US)

( * ) Notice: Subject to any disclaimer, the term of this patent is extended or adjusted under 35 U.S.C. 154(b) by 1073 days.

(21) Appl. No.: 17/668,939

(22) Filed: Feb. 10, 2022

(65) Prior Publication Data

US 2023/0252196 A1     Aug. 10, 2023

(51) Int. Cl.
*G06F 30/13*          (2020.01)
*G06F 30/27*          (2020.01)
(52) U.S. Cl.
CPC .............. *G06F 30/13* (2020.01); *G06F 30/27* (2020.01)
(58) Field of Classification Search
None
See application file for complete search history.

(56) References Cited

U.S. PATENT DOCUMENTS

| 10,404,569 B2 | 9/2019 | Hershey et al. |
| 10,522,854 B2 | 12/2019 | Wang |

| 10,798,175 B1 | 10/2020 | Knight et al. | |
| 10,868,857 B2 | 12/2020 | Park et al. | |
| 11,119,799 B2 | 9/2021 | Deutsch et al. | |
| 2014/0347492 A1* | 11/2014 | Fales ...................... H04N 23/11 | |
| | | | 348/164 |
| 2015/0235161 A1* | 8/2015 | Azar .................. G06Q 30/0261 | |
| | | | 705/7.15 |
| 2017/0286572 A1 | 10/2017 | Hershey et al. | |
| 2019/0005200 A1 | 1/2019 | Zimmerman et al. | |
| 2019/0138970 A1 | 5/2019 | Deutsch et al. | |
| 2019/0251489 A1 | 8/2019 | Berti et al. | |
| 2019/0266295 A1 | 8/2019 | Masuda et al. | |
| 2019/0354922 A1 | 11/2019 | Berti et al. | |
| 2020/0125053 A1 | 4/2020 | Park et al. | |
| 2021/0056309 A1* | 2/2021 | Mathwig ................. G06T 7/246 | |
| 2021/0081938 A1 | 3/2021 | Falk | |

FOREIGN PATENT DOCUMENTS

| CN | 108919765 B | 11/2018 |
| CN | 109116751 B | 1/2019 |
| CN | 111208759 B | 5/2020 |
| WO | 2020199503 A1 | 10/2020 |

* cited by examiner

*Primary Examiner* — Kamini S Shah
(74) *Attorney, Agent, or Firm* — Moore & Van Allen PLLC; Andrew T. Wood

(57)          ABSTRACT

Embodiments of the invention are directed to a system, computer program product, and computer-implemented method for electronic duplication and simulation of environments via a hardware device network. An environment and the conditions therein are represented in an electronic layout. A hardware device network comprising user devices and/or IoT devices continuously relay user locations within the environment via a link to the electronic layout. Predictive artificial intelligence and self-learning algorithms are implemented in the electronic layout to provide optimized conditions within the environment.

14 Claims, 4 Drawing Sheets

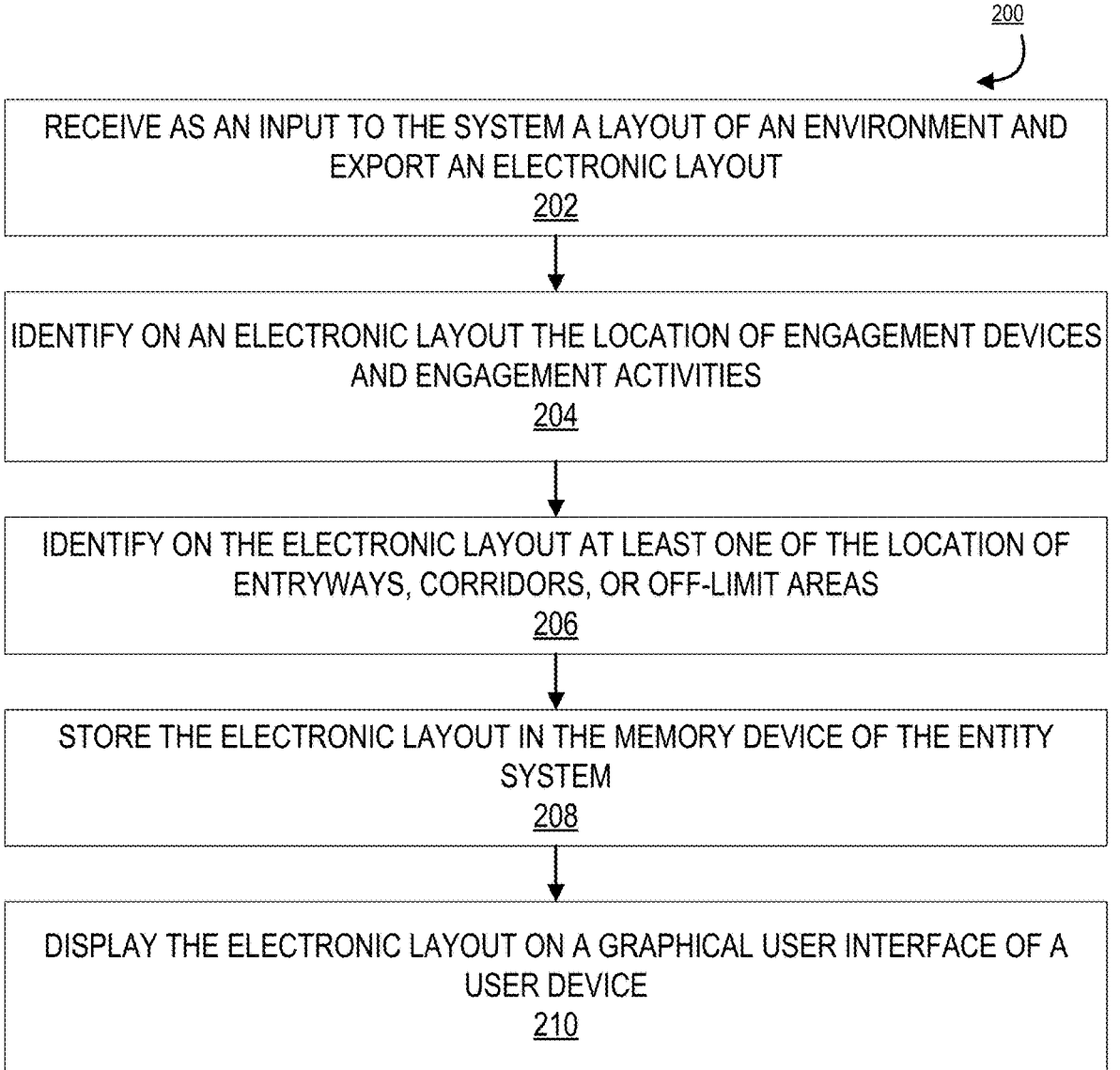

200

RECEIVE AS AN INPUT TO THE SYSTEM A LAYOUT OF AN ENVIRONMENT AND
EXPORT AN ELECTRONIC LAYOUT
202

IDENTIFY ON AN ELECTRONIC LAYOUT THE LOCATION OF ENGAGEMENT DEVICES
AND ENGAGEMENT ACTIVITIES
204

IDENTIFY ON THE ELECTRONIC LAYOUT AT LEAST ONE OF THE LOCATION OF
ENTRYWAYS, CORRIDORS, OR OFF-LIMIT AREAS
206

STORE THE ELECTRONIC LAYOUT IN THE MEMORY DEVICE OF THE ENTITY
SYSTEM
208

DISPLAY THE ELECTRONIC LAYOUT ON A GRAPHICAL USER INTERFACE OF A
USER DEVICE
210

FIG. 2

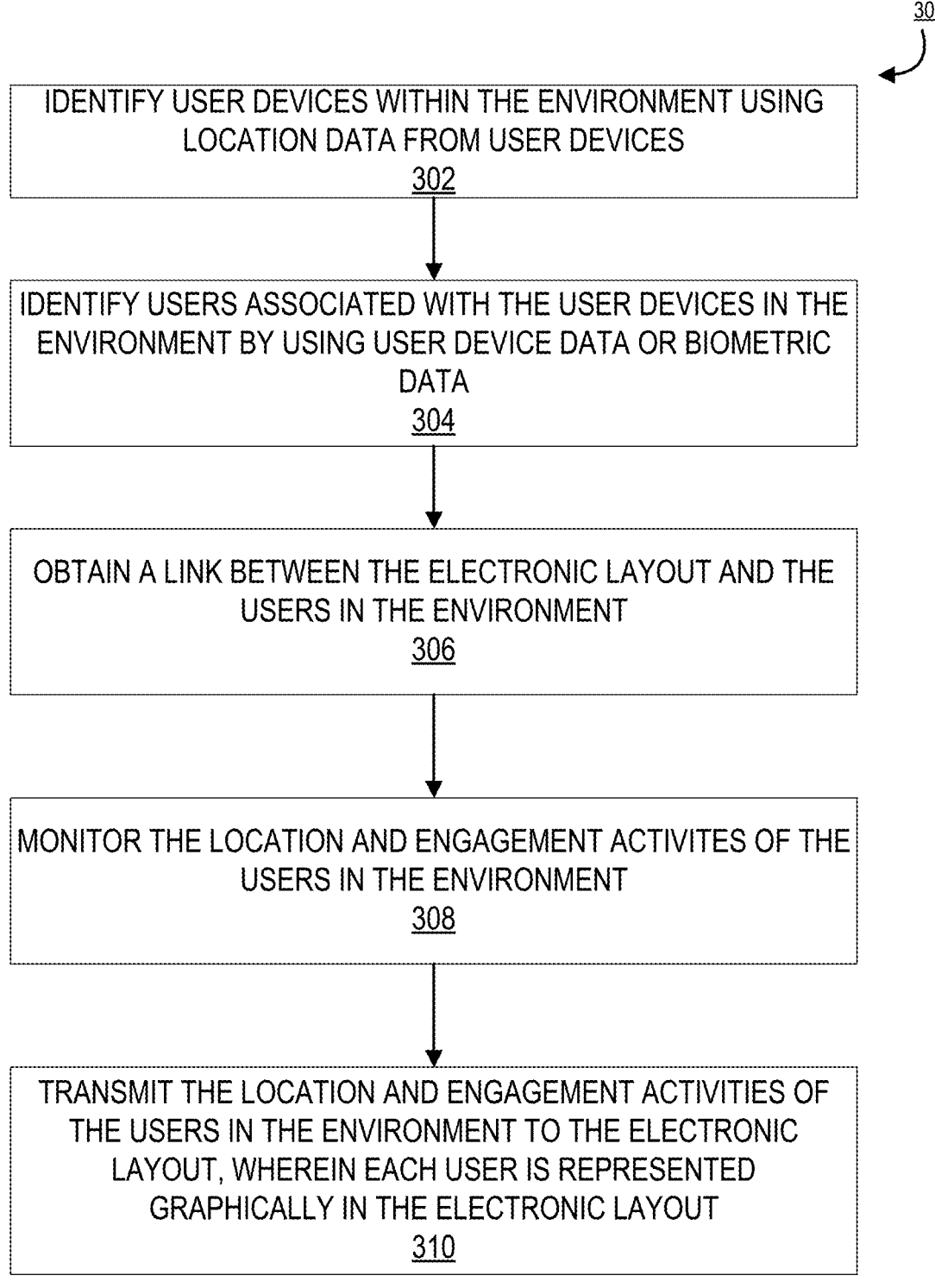

300

IDENTIFY USER DEVICES WITHIN THE ENVIRONMENT USING LOCATION DATA FROM USER DEVICES
302

IDENTIFY USERS ASSOCIATED WITH THE USER DEVICES IN THE ENVIRONMENT BY USING USER DEVICE DATA OR BIOMETRIC DATA
304

OBTAIN A LINK BETWEEN THE ELECTRONIC LAYOUT AND THE USERS IN THE ENVIRONMENT
306

MONITOR THE LOCATION AND ENGAGEMENT ACTIVITES OF THE USERS IN THE ENVIRONMENT
308

TRANSMIT THE LOCATION AND ENGAGEMENT ACTIVITIES OF THE USERS IN THE ENVIRONMENT TO THE ELECTRONIC LAYOUT, WHEREIN EACH USER IS REPRESENTED GRAPHICALLY IN THE ELECTRONIC LAYOUT
310

FIG. 3

SYSTEM AND METHOD FOR ELECTRONIC DUPLICATION AND SIMULATION OF ENVIRONMENTS VIA A HARDWARE DEVICE NETWORK

BACKGROUND

Currently, entities with physical locations where users interact with engagement devices, perform engagement activities, or interact with users associated with the entity rely on visual observation and computerized approximations of said visual observations of the physical locations to provide insight into points of inefficiency, bottlenecks, or the like. Oftentimes, when an environment is experiencing such inefficiencies, intervention is not possible as these inefficiencies are not monitored in real-time. Furthermore, the computerized approximations are not truly representative of the movement and engagement activities performed by a user, and they may lead to inaccurate optimizations. As such, there exists a need for a system and method for electronic duplication and simulation of environments via a hardware device network.

BRIEF SUMMARY

The following presents a simplified summary of one or more embodiments of the invention in order to provide a basic understanding of such embodiments. This summary is not an extensive overview of all contemplated embodiments and is intended to neither identify key or critical elements of all embodiments, nor delineate the scope of any or all embodiments. Its sole purpose is to present some concepts of one or more embodiments in a simplified form as a prelude to the more detailed description that is presented later.

Currently, environments of entities at any given time may be filled with users attempting, for example, to engage in activities with an entity, converse with a user associated with the entity, interact with engagement devices, or the like. As such, the environment may be overwhelmed by the number of users, disorganization and lack of communication surrounding user needs, and so forth. Some users associated with the entity may have a disproportionate number of tasks to perform, while other users associated with the entity may have less. Such disparities often lead to inefficient environments with confusion, with the potential for improvement of the environment.

There is a need for a system and method for duplicating the environment within the digital realm, such that an electronic layout of the environment, the users, various engagement devices, engagement activities, and so forth, are replicated in real-time on a graphical user interface of a user device. By replicating the environment, users associated with an entity (either at the environment or at a secondary location) may monitor the environment in real-time and adjust priorities of various users associated with the entity, system characteristics, queue formation at a plurality of queues surrounding engagement devices, or the like. Furthermore, environments and the users locations and engagement activity/device data may be recorded and saved over time to allow users associated with the entity to review past time histories of the environment and learn from the engagement activities such that optimization and improving efficiencies may occur.

Embodiments of the present invention address the above needs and/or achieve other advantages by providing apparatuses (e.g., a system, computer program product and/or other devices) and methods for electronic duplication and simulation of environments via a hardware device network.

Embodiments of the invention are directed to a system, method, or computer program product for electronic duplication and simulation of environments via a hardware device network, the system, method, or computer program product comprising receiving, as an input to the system, a layout of an environment, wherein the layout of the environment comprises at least one of walls, objects, or boundaries, generating an electronic layout from the system, wherein the electronic layout comprises an electronic format of the environment, and wherein the electronic layout comprises a graphical representation of the environment, identifying on the electronic layout the location of at least one engagement device and at least one engagement activity, wherein the at least one engagement device and the at least one engagement activity comprise throughput rates, identifying on the electronic layout at least one location of entryways or off-limit areas, wherein the entryways are monitored for the flow of the users through the entryways, and wherein the off-limit areas are designated to not be monitored by the electronic layout, storing the electronic layout in the memory device of the entity system, wherein the electronic layout is stored for use at a later date, and displaying the electronic layout on a graphical user interface of a user device.

In some embodiments, or in combination with any of the previous embodiments, the system, method, or computer program product further comprises identifying user devices within the environment, wherein the user devices are co-located with users, and the location of the users is identified using location data provided to the system from the user devices, identifying the users associated with the user devices within the environment by receiving user device data or biometric data, wherein each of the user device data or biometric data matches a user with an account associated with the user, obtaining a link between the electronic layout and the users in the environment, wherein the link establishes ongoing communication of location of the users to the system such that the location of the users moving about the environment is known to the system, monitoring the locations and the engagement activities of the users in the environment, wherein the locations and the engagement activities are continuously communicated via the link, and transmitting the location and engagement activities of the users in the environment to the electronic layout, wherein the locations of the users and the engagement activities of the users are represented graphically in the electronic layout.

In some embodiments, or in combination with any of the previous embodiments, the system, method, or computer program product further comprises receiving from the memory device of the system the electronic layout, wherein the electronic layout comprises the identification of the users, locations of the users, and engagement activities of the users, generating assessment models of electronic layouts comprising user interactions and user traffic, displaying the assessment models on the graphical user interface of the user device, identifying areas of improvement for user interactions and user traffic, and improving the electronic layout by implementing predictive artificial intelligence, wherein the predictive artificial intelligence predicts a reason for visiting the environment for the users.

In some embodiments, or in combination with any of the previous embodiments, the improving the electronic layout by implementing the predictive artificial intelligence further comprises self-learning, wherein self-learning improves future predictions by continuously adjusting the predictive artificial intelligence based on outputs from the electronic layout.

In some embodiments, or in combination with any of the previous embodiments, the location data provided to the system from the user devices comprises global positioning system data received from an application on the user device, wherein the application is configured to notify the entity system when the user device is within the environment, and the entity system thereafter receives more detailed or more frequent geographic coordinate/positioning information.

In some embodiments, or in combination with any of the previous embodiments, the system, method, or computer program product further comprises identifying the users interacting with IoT devices within the environment by receiving data from the IoT devices.

In some embodiments, or in combination with any of the previous embodiments, the electronic layout received from the memory device of the system is an electronic layout from a prior time period wherein the engagement activities of the users are monitored on the graphical user interface of the user device for the prior time period.

The features, functions, and advantages that have been discussed may be achieved independently in various embodiments of the present invention or may be combined with yet other embodiments, further details of which can be seen with reference to the following description and drawings.

BRIEF DESCRIPTION OF THE DRAWINGS

Figure 1:
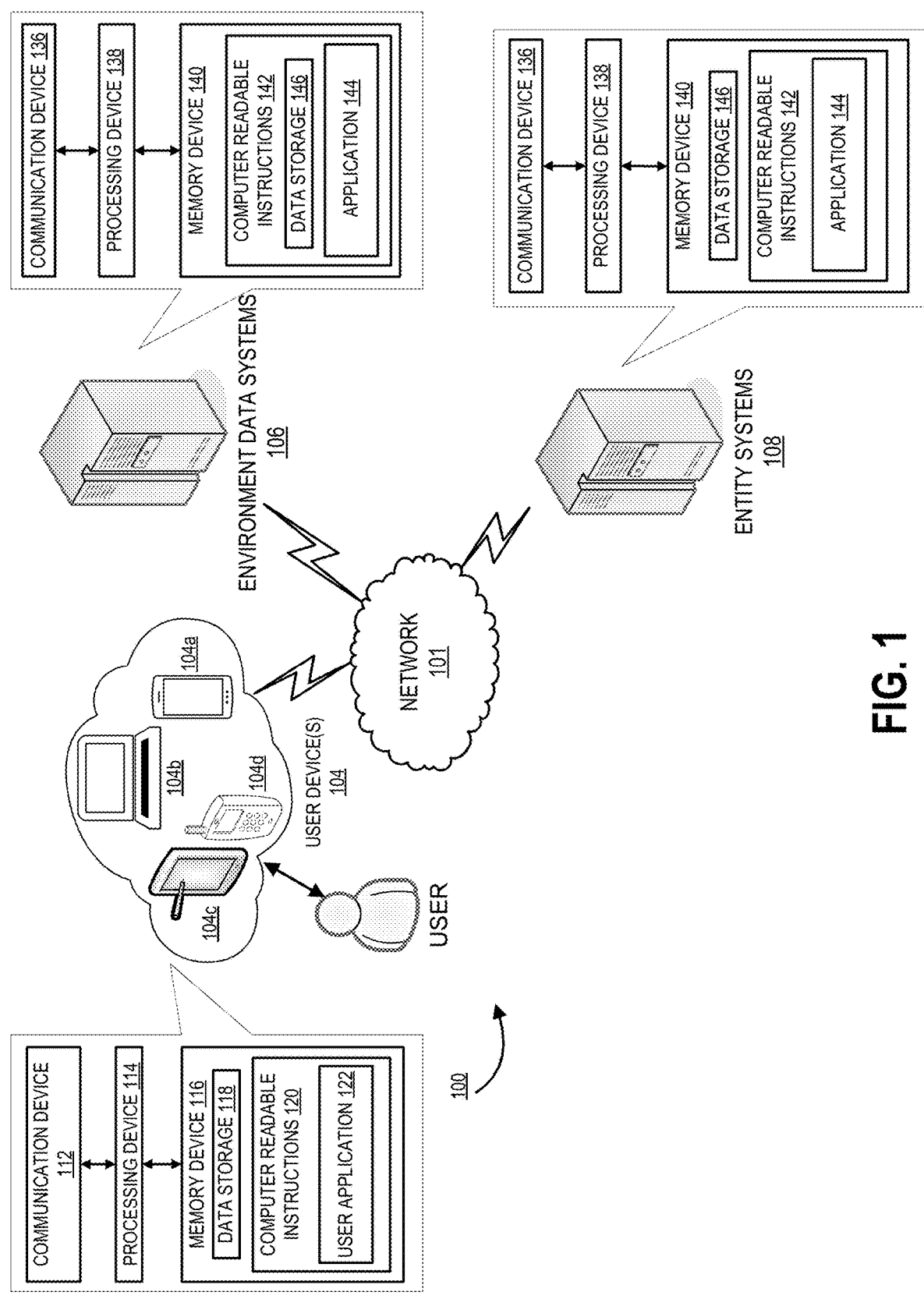
Figure 4:
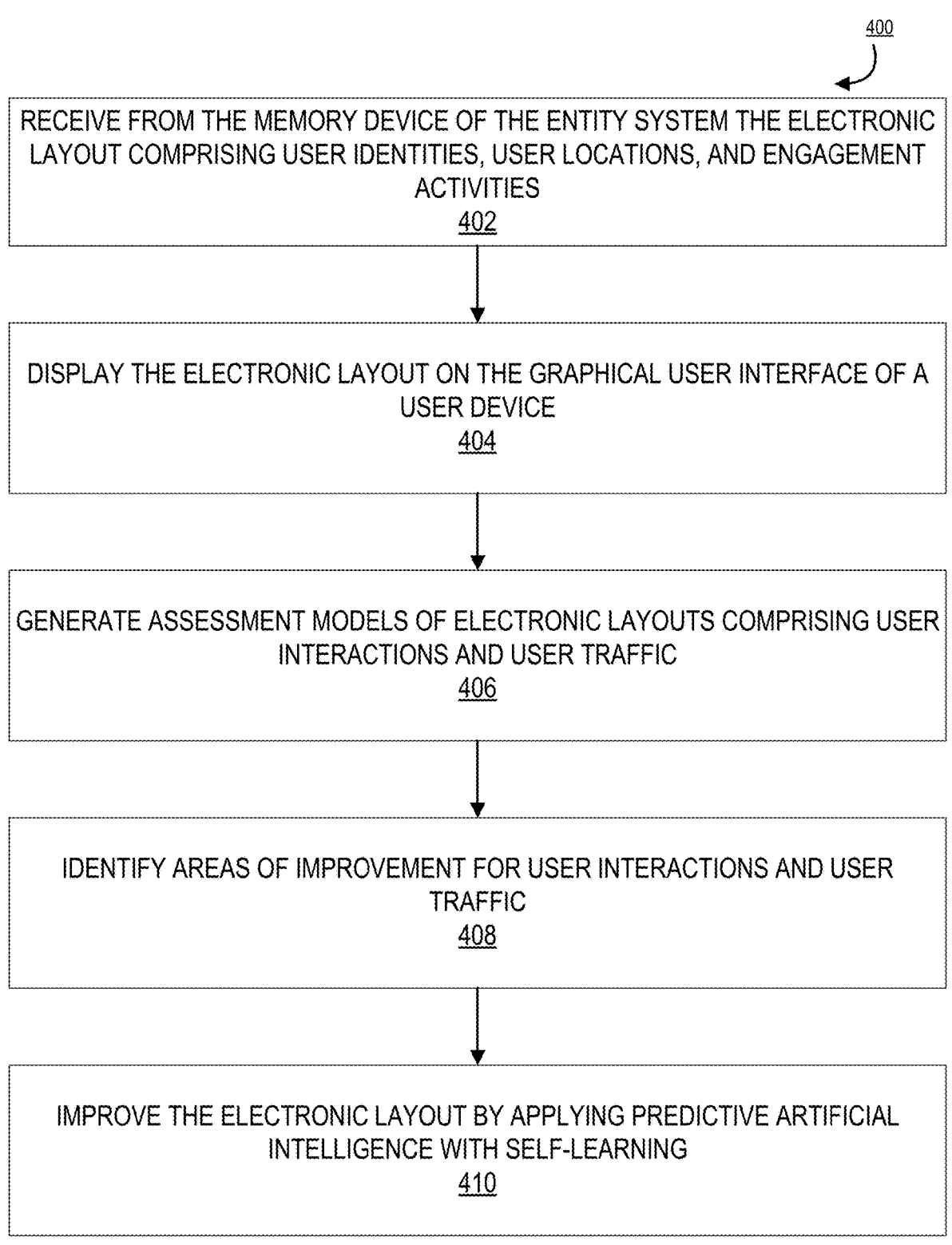

Having thus described embodiments of the invention in general terms, reference will now be made to the accompanying drawings, wherein:

FIG. 1 illustrates a network environment in which the processes described herein are implemented, in accordance with some embodiments of the present invention;

FIG. 2 illustrates a block diagram of a system and method for electronic duplication of environments, in accordance with some embodiments of the present invention;

FIG. 3 illustrates a block diagram of a system and method for electronic duplication and simulation of environments via a hardware device network, in accordance with some embodiments of the present invention; and FIG. 4 illustrates a block diagram of a system and method for electronic simulation of environments via a hardware device network, in accordance with some embodiments of the present invention.

DETAILED DESCRIPTION OF EMBODIMENTS OF THE INVENTION

Embodiments of the present invention now may be described more fully hereinafter with reference to the accompanying drawings, in which some, but not all, embodiments of the invention are shown. Indeed, the invention may be embodied in many different forms and should not be construed as limited to the embodiments set forth herein; rather, these embodiments are provided so that this disclosure may satisfy applicable legal requirements. Like numbers refer to like elements throughout. Where possible, any terms expressed in the singular form herein are meant to also include the plural form and vice versa, unless explicitly stated otherwise. Also, as used herein, the term "a" and/or "an" shall mean "one or more," even though the phrase "one or more" is also used herein. Furthermore, when it is said herein that something is "based on" something else, it may be based on one or more other things as well. In other words, unless expressly indicated otherwise, as used herein "based on" means "based at least in part on" or "based at least partially on."

Embodiments of the invention are directed to a system, computer program product, and computer-implemented method for electronic duplication and simulation of environments via a hardware device network. An environment and the conditions therein are represented in an electronic layout, wherein a hardware device network comprising user devices and/or IoT devices continuously relay user locations within the environment via a link to the electronic layout. Predictive artificial intelligence and self-learning algorithms are implemented to provide optimized conditions within the environment.

In accordance with embodiments of the invention, the term "entity" may be used to include any organization or collection of users that may interact with a network. An entity may refer to a business, company, or other organization that either maintains or operates the system or requests use and accesses the system. "Entity" may be used to include any organization that processes financial transactions including, but not limited to, banks, credit unions, savings and loan associations, investment companies, stock brokerages, resource management firms, insurance companies or the like. However, an entity may also be other organizations such as merchant locations, retail shops, community management associations, commercial real estate organizations, schools, and so forth.

A "user" as used herein may refer to any entity or individual associated with the system. In some embodiments, a user may be a computing device user, a phone user, a mobile device application user, a financial institution customer (e.g., an account holder or a person who has an account (e.g., banking account, credit account, or the like)), a system operator, database manager, a support technician, and/or employee of an entity. In some embodiments, identities of an individual may include online handles, usernames, identification numbers (e.g., Internet protocol (IP) addresses), aliases, family names, maiden names, nicknames, or the like. In some embodiments, the user may be an individual or an organization (i.e., a charity, business, company, governing body, or the like). In some embodiments, a "user associated with an entity" may be any associate or employee of an entity assigned to carry out tasks or engagement activities for the entity. The user associated with an entity may be an associate interacting with users, providing technical help or managing the accounts of a user. In other embodiments, the user associated with an entity may be an IT professional or project manager assigned to use the system described herein, and/or implement various efficiency improvements identified, or the like.

Furthermore, as used herein the term "user device" may refer to any device that employs a processor and memory and can perform computing functions, such as a personal computer or a mobile device, wherein a mobile device is any mobile communication device, such as a cellular telecommunications device (i.e., a cell phone or mobile phone), personal digital assistant (PDA), a mobile Internet accessing device, or other mobile device. Other types of mobile devices may include portable digital assistants (PDAs), pagers, wearable devices, mobile televisions, laptop computers, cameras, video recorders, audio/video player, radio, global positioning system (GPS) devices, or any combination of the aforementioned. In some embodiments, a device may refer to an entity's computer system, platform, servers, databases, networked devices, or the like. The device may be used by the user to access the system directly or through an application, online portal, internet browser, virtual private network, or other connection channel. The device may be a computer device within a network of connected computer devices that share one or more network storage locations.

As used herein, the term "engagement devices" may refer to electronic hardware devices associated with the entity for use in relations with customers of the entity through automation and computing servicing, such as automated teller machines (ATMs), kiosks, computer terminals, point-of-sale (POS) locations, or the like. In some embodiments, many engagement devices are distributed across an enterprise that may cover a large geographical region, including across the world. As such, the engagement devices may be disparate, separate, or otherwise at least partially independent of one another throughout the enterprise.

As used herein, the term "engagement activities" may refer to activities of which a user takes part in, either with an engagement device or with a user associated with an entity. For example, a particular engagement activity in an environment may be interacting with an automated teller machine, or a POS system. In another embodiment, an engagement activity may be talking with a user associated with an entity about a product or service which the entity may provide to the user. In this way, an engagement activity may comprise any activity in which the user is interacting with some aspect of the entity other than walking in the environment, waiting in a queue, and so forth. An engagement activity may be short or long in duration, for example a short duration engagement activity may simple be the verbal greeting provided to the user by a user associated with the entity upon entrance or exit to the environment, whereas a long duration engagement activity may involve a user associate with the entity providing counseling or instructional services to a user as it pertains to a user's account with the entity.

As used herein, the term "environment" may refer to a brick-and-mortar storefront of an entity, typically where users associated with the entity or engagement devices interact with users. In other embodiments, environments may be open areas outside of a storefront setting, such as locations where a one or more engagement devices are outside or located within the environment of a separate entity, for example a cluster of ATMs at a street corner or within a convenience store. In yet additional embodiments, an environment may refer to an entire building such as an office building, skyscraper, arena, stadium, and so forth.

As used herein, the term "electronic layout" may refer to the electronic representation of an environment generated and stored on the entity systems or environment data systems. The electronic layout is an interactive graphical image of the layout of the environment, with the features of the environment (such as walls, corridors, entryways, etc) represented by similar features in the electronic layout. The engagement devices are represented by similar representative features within the electronic layout, and the users as well and the users associated with the entity are likewise represented in the electronic layout. In this way, a simplified model of the environment is created and shown graphically on a graphical user interface.

As used herein, the term "link" may refer to the connection between one or more user devices and/or Internet of Things ("IoT") devices to the entity system or environment system through a wireless signal or network of wireless signals that positively identifies one or more parties to the connection and allows a communication (e.g. sending and/or receiving of data) through the wireless signal. A link may occur as a result of geographic proximity to a device which hosts or transmits/receives a wireless signal, such as Bluetooth short range wireless, Near Field Communication ("NFC"), Wi-Fi, free-space optical communication ("FSO"), infrared ("IR"), sonic or ultrasonic radio, GPS, cellular data such as GSM, CDMA, GPRS, through 3G, 4G, or 5G networks, low-power wide-area networks ("LP-WAN"), satellite communications, or the like In some embodiments a link is established without a necessary intervention by a user on a user device, such as entering a password or clicking/pressing a portion of the graphical user interface to confirm acceptance of the link. In other embodiments, a user may be required to complete a necessary step such as the aforementioned intervention in order to establish a connection with the wireless signal and thereby establish a link.

FIG. 1 illustrates a system that includes specialized systems and devices communicably linked across a network to perform a method for generating and transmitting shareable electronic notification data via a hardware device network. FIG. 1 provides an environment 100 for the system, in accordance with one embodiment of the present invention.

As illustrated in FIG. 1, the entity systems 108 is operatively coupled, via a network 101 to the user device 104, and to environment data systems 106. In this way, entity systems 108 can send information to and receive information from the user device 104 and environment data systems 106. It shall be noted that in some embodiments of the invention, environment data systems 106 are merely systems along entity systems 108, and as such entity systems 108 may comprise environment data systems 106. FIG. 1 illustrates only one example of the system environment 100, and it will be appreciated that in other embodiments one or more of the systems, devices, or servers may be combined into a single system, device, or server, or be made up of multiple systems, devices, or servers.

The network 101 may be a global area network (GAN), such as the Internet, a wide area network (WAN), a local area network (LAN), or any other type of network or combination of networks, including wireless networks. The network 101 may provide for wireline, wireless, or a combination wireline and wireless communication between devices on the network.

FIG. 1 also illustrates a user device 104. The user device 104 may be any communication device such as a smart phone 104a, a telephone 104d, a tablet 104c, a computer 104b, or the like. The user device 104 generally comprises a communication device 112, a processing device 114, and a memory device 116. The processing device 114 is operatively coupled to the communication device 112 and the memory device 116. The processing device 114 uses the communication device 112 to communicate with the network 101 and other devices on the network 101, such as, but not limited to the entity systems 108 and environment data systems 106. As such, the communication device 112 generally comprises a modem, server, or other device for communicating with other devices on the network 101.

As further illustrated in FIG. 1, the user device 104 comprises computer-readable instructions 120 stored in the memory device 116, which in one embodiment includes the computer-readable instructions 120 of a user application 122 and data storage 118. A user device 104 may be any communication device, such as a cellular telecommunications device (i.e., a cell phone or mobile phone), personal digital assistant (PDA), a mobile Internet accessing device, or other mobile device including, but not limited to portable digital assistants (PDAs), pagers, mobile televisions, voice assistants, laptop computers, cameras, video recorders, audio/video player, radio, GPS devices, any combination of the aforementioned, or the like. Although only one user device 104 is depicted in FIG. 1, the system environment 100 may comprise a plurality of user devices 104. In some embodiments of the invention described herein, a plurality of user devices 104 is used.

As illustrated in FIG. 1, the entity systems 108 generally comprises a communication device 136, a processing device 138, and a memory device 140. As used herein, the term "processing device" generally includes circuitry used for implementing the communication and/or logic functions of the particular system. For example, a processing device may include a digital signal processor device, a microprocessor device, and various analog-to-digital converters, digital-to-analog converters, and other support circuits and/or combinations of the foregoing. Control and signal processing functions of the system are allocated between these processing devices according to their respective capabilities. The processing device may include functionality to operate one or more software programs based on computer-readable instructions thereof, which may be stored in a memory device.

The processing device 138 is operatively coupled to the communication device 136 and the memory device 140. The processing device 138 uses the communication device 136 to communicate with the network 101 and other devices on the network 101, such as, but not limited to the environment data systems 106 and the user device 104. As such, the communication device 136 generally comprises a modem, server, or other device for communicating with other devices on the network 101.

As further illustrated in FIG. 1, the entity systems 108 comprises computer-readable instructions 142 stored in the memory device 140, which in one embodiment includes the computer-readable instructions 142 of an application 144. In some embodiments, memory device 140 includes data storage 146 for storing data related to the system environment, but not limited to data created and/or used by the application 144.

Embodiments of the entity systems 108 may include multiple systems, servers, computers or the like maintained by one or many entities. FIG. 1 merely illustrates one of those systems. In one embodiment of the invention, the entity systems 108 is operated by a second entity that is a different or separate entity from environment data systems 106. In some embodiments, the environment data systems 106 may be part of the entity systems 108. Similarly, in some embodiments, the entity systems 108 is part of the environment data systems 106.

In one non-limiting example of the entity systems 108 the memory device 140 stores an application 144. In one embodiment of the invention, the application 144 may comprise computer executable program code that instructs the processing device 138 to operate the communication device 136 to perform certain communication functions described herein. In one embodiment, the computer-executable program code of an application associated with the network and application 144 may also instruct the processing device 138 to perform certain logic, data processing, and data storage functions of the application.

The processing device 138 is configured to use the communication device 136 to gather data, such as data corresponding to reward data, electronic notification data, data regarding the geographic location of the user, or the like. The processing device 138 stores the data that it receives in its memory device 140.

Environment data systems 106 are each operatively coupled to entity systems 108, user device 104, and/or each other through network 101. Environment data systems 106 have systems with devices the same or similar to devices described for entity systems 108 and/or user device 104 (i.e., communication device, processing device, memory device). Therefore, environment data systems 106 communicate with each other, and/or with user device 104, and/or with entity systems 108 in the same or similar way as previously described with respect to each system.

As such, environment data systems 106 each generally comprise a communication device, at least one processing device, and a memory device. As used herein, the term "processing device" generally includes circuitry used for implementing the communication and/or logic functions of the particular system. For example, a processing device may include a digital signal processor device, a microprocessor device, and various analog-to-digital converters, digital-to-analog converters, and other support circuits and/or combinations of the foregoing. Control and signal processing functions of the system are allocated between these processing devices according to their respective capabilities. The processing device may include functionality to operate one or more software programs based on computer-readable instructions thereof, which may be stored in a memory device.

The processing device is operatively coupled to the communication device and the memory device. The processing device uses the communication device to communicate with the network 101 and other devices on the network 101. As such, the communication device generally comprises a modem, server, wireless transmitters or other devices for communicating with devices on the network 101. The memory device typically comprises a non-transitory computer readable storage medium, comprising computer readable/executable instructions/code, such as the computer-readable instructions, as described below.

As further illustrated in FIG. 1, environment data systems 106 each comprise computer-readable instructions or computer readable program code stored in the memory device. The computer readable instructions, when executed by the processing device 138 are configured to cause the processing device to perform one or more steps described in this disclosure.

It is understood that the servers, systems, and devices described herein illustrate one embodiment of the invention. It is further understood that one or more of the servers, systems, and devices can be combined in other embodiments and still function in the same or similar way as the embodiments described herein.

FIG. 2 illustrates a block diagram 200 of a method for electronic duplication of environments via a hardware device network, in accordance with some embodiments of the present invention. As illustrated in block 202, the system first begins by receiving as an input to the system a layout of an environment. As previously described, an environment may be the interior of a building such as a store or storefront, or it may be an outdoors location comprising an engagement device of which users (typically customers of an entity) are in communication with. The system relies heavily on the geometric layout of such environments, and as such the system is configured to received graphical representation of the layout on a graphical user interface. The layout of the environment it typically drawn or reproduced on the GUI using computer-aided design ("CAD"), wherein a user associated with the entity enters dimensions for each of the major features of the environment, such as the exterior walls, interior walls, sidewalk locations, street locations, or the like. The dimensions/sizes of such features (e.g., length, width, height, thickness, etc.) as well as the distances between such features are entered, either in two-dimensions ("2D") or three dimensions ("3D").

The layout may also comprise objects, such as those objects which are deemed to be critical in representing the environment, such that the objects present challenges to user flow through the environment. For example, one environment may comprise a large architectural column through the middle portion of the environment, such that the architectural column inhibits users within the environment from traversing the environment freely (i.e., the users must walk around the column). In this way, the size and location architectural column should be input to the system in order for the electronic layout to accurately depict the environment.

In situations where walls are not present in the environment, for example an outdoors open-air environment, boundaries may need to be established on the electronic layout to determine which areas on the environment will be utilized for the electronic layout. This may be an arbitrary boundary, such as a square of a given size (for example 50 ft×50 ft), or as is the case in some environments, natural boundaries may be utilized and represented by any number of shapes and/or lines in the electronic layout. For example, sidewalks, naturally wooded areas, etc.

The information entered by the user associated with the entity to the system is then exported, or generated, as a graphical representation is displayed on the GUI. This graphical representation (e.g. the electronic layout) is an electronic format of the environment and may be viewed in 2D or 3D.

Block 204 continues the process by identifying on the electronic layout the location of engagement devices and engagement activities. First, the system is configured to receive as an input from the user associated with the entity the location of engagement devices. For example, an engagement device such as an automated teller machine may be within the environment, and as such it is important to note its location. In this way, engagement devices which are commonly utilized by users within the environment may be monitored for usage, the amount/lengths of lines (queues) at any given moment to determine the wait time required for a user to interact with the engagement device, computer memory usage at the engagement device, locations, throughput rate, conversion rate (i.e. percentage of engagements at the engagement device which result in an intended outcome, such as completion of paperwork, completion of a sale, completion of opening an account with the entity, and so forth), length of queues, number of users in a queue, or the like.

Similarly, the location of engagement activities may also be identified, i.e. received as an input to the electronic layout by a user associated with the entity. Locations of engagement activities, for example, may be a specific desk or counter where the users seek to interact with the entity or user(s) associated with the entity. For example, at a retail location, one location of an engagement activity is the customer service desk, while another location of an engagement activity is the check-out counter, where a user is purchasing goods or services. As such, much in the same way as occurs at locations of engagement devices, users may tend to form queues while waiting to engage with the entity at the location of the engagement activities. Therefore, it is beneficial for the entity to enter the location of the engagement activities such that the engagement activities' locations, throughput rate, conversion rate (i.e. percentage of engagements at a location of an engagement activity which result in an intended outcome, such as completion of paperwork, completion of a sale, completion of opening an account with the entity, and so forth), length of queues, number of users in a queue, or the like.

In block 206, a user identifies on the electronic layout, typically on the graphical user interface, at least one of the location of entryways, corridors, or off-limit areas. Entryway identification (such as doors for entry or exit) may be critical in some embodiments of environments, because certain entryways may only be able to allow a select number of users through the entryway at any given time. In circumstances where a large number of users are expected to enter an environment at the same time, it may be important to be able to monitor the flow of users through said entryways. Furthermore, in some embodiments, identifying entryways allows the system to add or remove users from the electronic layout upon their entrance and/or exit through said entryways. In this way, a proper count of users is maintained. In other embodiments, the entryway may be so irrelevant to the environment and the efficiency of the environment that the user building the electronic layout may wish to identify the entryway as "off-limits", such that user locations within the corridor are not monitored or identified at all.

In a similar way, corridors may be identified on the electronic layout by the user associated with the entity. Like entryways, corridors may only allow a certain number of users to pass though the corridor at any given time. As such, it may be important to model the number of users at any time within a corridor, such that users can be rerouted to other locations in order to improve the efficiency of the environment. In other embodiments, the capacity of a corridor may be so irrelevant to the environment and the efficiency of the environment that the user building the electronic layout may wish to identify the corridor as "off-limits", such that user locations within the corridor are not monitored or identified at all.

Furthermore, specific off-limits areas may be identified on the electronic platform for areas where users may not be tracked or monitored for the activities of the user. The off-limits areas may include restrooms, private offices, corridors, entryways, natural areas, areas hindered by obstacles, areas with temporary or permanent obstructive features, or the like. Off-limits areas may be identified graphically on the electronic layout using a specialized color, pattern, or text.

Continuing with block 208, the electronic layout may now be stored in the memory device of the entity system(s) such that the electronic layout is capable of being recalled by a user associated with the entity at any given time. In this way, the entity system may comprise a plurality of electronic layouts, each electronic layout representing one of the plethora of environments associated with the entity. For example, an entity may have 2,000 stores, and by storing in the memory device, any of the environments associated with any of the stores is capable of being recalled for monitoring, modification due to construction or renovation, used as a starting point for creation of a new electronic layout in an identical or similar environment, and so forth.

Throughout this disclosure, it is important to note that each of the electronic layouts will be able to actively monitor and simulate their respective environments, as well as record user locations, experiences, engagements with engagement activities or engagement devices, or the like, and store the recording on the same memory device. In this way, a particular event, for example a large crowd of users entering the environment during a busy day, can be retro-actively "replayed" at a later time in order to understand the environment, suggest improvements to the environment, offer training tips, optimize the environment, debug systems, or the like. The replaying of the saved recorded time period for any given electronic layout may be watched in fast forward, slow motion, regular speed, reverse, or any speeds and directions therebetween.

The process continues in block 210 by displaying the electronic layout on a graphical user interface of a user device. As previously mentioned, the electronic layout may be 2D, 3D, virtual reality ("VR"), or the like. In some embodiments, the electronic layout may be rendered with accurate surfaces, colors, and textures, or overlayed with photographs of the environment such as to provide a more realistic simulation of the environment. In any case, the data within the electronic layout is transformed into graphical representations of the data in a way such that a user is able to see, either real-time ("live"), or retroactively, a plurality of users throughout an environment and the way in which each user interacts with the environment, users associated with the entity located in the environment, engagement activities, and interaction with and location of engagement devices in the environment.

Not only is the electronic layout itself represented graphically and displayed on the graphical user interface, but each of the users within the environment are also represented graphically and displayed on the graphical user interface. In some embodiments, the identities of the users such as name, address, may be hidden from view or anonymized on the display, such that private information is hidden and/or encrypted. In other embodiments, certain types of information such as name, address, length of time as a customer, characteristics such as residence, citizenship, etc., wait time for each of the users, or the like may be displayed alongside the graphical representation of the user. In this way the system is able to make determinations of the types of users received at any given environment, disparities in wait time, and so forth. The representation of the users may also be accommodated by an identifying photo or avatar for users who are members of the entity and are known to the entity system.

FIG. 3 illustrates a block diagram 300 of a system and method for electronic duplication and simulation of environments via a hardware device network, in accordance with some embodiments of the present invention.

The process begins in block 302, wherein the system identifies user devices within the environment using location data from user devices. User devices typically comprise a GPS chip which is configured to transmit the coordinates (longitude and latitude) to an entity with permissions to receive such coordinates. The user device may also be configured to determine geographical coordinates using other methods such as triangulation from cellular network towers, triangulation from Wi-Fi transmitters, and so forth. A typical user device may also be loaded with an application, which has been downloaded to the user device by the user, the application associated with the same entity as is associated with the environment as previously described. Typically, such applications request permission from the user to receive geographic coordinate location information from the user device, and as such the entity may receive such information on a periodic or regular basis. The application may be configured to notify the entity system when the user device is within the premises of the environment, and the electronic layout may begin to receive more detailed or more frequent geographic coordinate/positioning information upon such occurrence. In this way, the entity is able to track, in real time, the location of all user devices in such a configuration while the user device is within the environment.

In some embodiments, users may not have user devices on their persons, rather users may interact with Internet of Things ("IoT") devices connected to the network to identify to the network that a user in indeed within the environment. For example, a security camera may be an IoT device capable of identifying users within an environment by recognizing features determined to belong to humans. Such cameras may also capable of capturing movements of said users throughout the environment, typically by distinguishing one user from each of the other users by numerous methods including facial recognition, measuring the distance between pupils of each user, analyzing the gait of each user, or the like.

Block 304 continues by identifying users associated with the user devices in the environment by using user device data or biometric data. As previously mentioned, entities in control of an environment are able to identify user devices throughout the environment and note on the electronic layout the location of each user device. Similarly, when a user device is connected to the entity, either by executable application or otherwise, the system is configured to match, e.g. pair, the information known about the user device and the user themselves. For example, the system may associate an identifier of a user device such as the MAC address, IP address, FCC ID, application installation number, login credentials, or the like with an individual user registered with the entity through the computer executable application. In this way, the entity intelligently recognizes the user's personal identification information, account information, any history of purchases or resource transfers, pending purchases, contemplated or initiated purchases or resource transfers, and the like.

Such information is critical in the entity predicting the reason for the user's presence within the environment at any given time. For example, a user may have begun the process for apply for a particular good or service at a different time or location, but the user may have stopped this application process prematurely. As such, the system of the entity may recognize that there is a high probability that this user is present in the environment to complete this process and finish applying. The system, using this prediction, may be able to arrange resources to interact with the user, such as users associated with the entity who are capable of helping the using to complete the process.

It should be noted, however, that not all users within the environment will be equipped with user devices of which the entity is able to identify the users. Therefore, other systems may be utilized to do such identification, including but not limited to biometric data (facial recognition based on stored images of users, fingerprint recognition, or the like). Furthermore, there likely will be additional users of which the entity has no information whatsoever, and as such the entity may still want to track these users' positions within the environment on the electronic layout. As previously mentioned, IoT devices such as cameras, proximity sensors, infrared sensors, or the like may be used to sense the presence of a user, yet not know the user's identity.

Block 306 continues by obtaining a link between the electronic layout and the users in the environment. While at this point the system has identified user devices and users in the environment, a link has not yet been established between the electronic layout and the users and/or user devices yet. In obtaining the link, the system is configured to constantly receive, and periodically record information about the user, such as the user's location, the engagement activities the user in engaging in, the engagement devices in which the user is interacting, or the like.

In block 308, the system is configured to monitor, via the link, the location and engagement activities of the user in the environment. As previously described, the geographic coordinate information may be determined by various user devices in various ways, such as GPS, wireless cellular network triangulation, or the like. Regardless of the method of determining such information, the system is configured to regularly receive updates of the user device location through an application on the user device. In this way, the system receives location information of the user in the environment, using the user device as a proxy for detecting the location of the user device.

In other embodiments, users without user devices capable of obtaining a link with the electronic layout may also have their locations within an environment monitored by using IoT devices throughout the environment. As one non-limiting example of the use of IoT devices, and as previously described, one or more IoT-enabled video cameras at the environment may be configured track the locations of users within the environment, having previously identified that the users are within the environment. The IoT device may approximate the distance of the user(s) from the IoT devices, and either i) monitor locations of the user(s) by computing/calculating the changes in the approximated distances of the user(s) from the IoT device, or ii) refining the approximation of the distance of the user by comparing the approximation to approximations of other IoT devices, triangulating a position of each user, and monitoring the locations of the user(s) by computing/calculating the changes in the triangulated position. Other IoT devices such as automated teller machines (ATMs), door sensors, or the like are also configured to interact with the electronic layout in a similar manner via a link.

Furthermore, the engagement activities of each of the users may be monitored throughout the users' presence in the environment. In some embodiments, the specific engagement activities to which a user in engaging in may be deduced by the system with a determined confidence interval by monitoring the amount of time a user is located in an area specified to be an area of engagement activity occurrence in the electronic layout, such as described in block 204 of FIG. 2. For example, if the electronic layout has an area such as a desk that is primarily used for opening an account, and the system determines that one user has been at the desk along with a user associated with the entity such as an employee, the system may intelligently determine that the user is engaging in the engagement activity of opening an account.

In other embodiments, the system may be connected to additional IoT devices such as proximity sensors, pressure pads, or other sensors configured to determine the whereabouts of users within the environment. In this way, the electronic layout may receive addition data for positive affirmation of the presence of a user in an area designated to be a place of engagement activities, engagement devices, or the like.

In some embodiments, engagement devices themselves are likewise implemented as IoT devices, such that information received from users or users associated with the entity may be used to monitor the engagement activities and/or locations of users within an environment. Such engagement devices may provide specific details regarding the reason for the user's entrance in the environment, the specific goods or services in which the user is interested, the status of ongoing or in-process goods or service transactions, or the like. For example, an ATM may act as an IoT device within this system, confirming the location of the user next to the ATM, and also monitoring the engagement activities the user is involved in at the ATM such as depositing a check, opening an account, or the like. In this way, the electronic layout not only has accurate location data for the user, the identification of the user by the user's interaction with the ATM, but also the types of goods and services which the user is actively seeking involvement with.

Finally, in block 310 the data obtained as a result of monitoring the location and engagement activities of the users is transmitted to the electronic layout, wherein each user is represented graphically in the electronic layout. Since one of the advantages of the electronic layout is real-time monitoring of environments, blocks 302 through 310 may occur repetitiously and frequently multiple times per second or minute, such that the locations and engagement activities represented graphically in the electronic layout do not lag behind the real world activities within the environment.

FIG. 4 illustrates a block diagram 400 of a system and method for electronic simulation of environments via a hardware device network, in accordance with some embodiments of the invention. What has been discussed up to this point has been primarily real-time monitoring of environments via the electronic layouts, along with the ability to retroactively review environments from recordings of electronic layouts saved in the memory device of the entity systems. However, the system disclosed herein contains many other useful capabilities which will now be explained in detail.

The process begins in block 402, wherein the system receives from the memory device of the entity system the electronic layout comprising user identities, user locations, and engagement activities. The system may request and receive a single "snapshot" of the electronic layout from a point in time in the past, or in some embodiments the system may request and receive all data from a range of dates and/or times. In one non-limiting example, to analyze peak traffic flow of users through an environment, it may be beneficial to aggregate electronic layout data from multiple days, but only during peak traffic times such as 9 am through 10 am. As such, a user associated with the entity is capable of requesting and receiving such aggregated data in any number of combinations. In another non-limiting example, the user associated with the entity may want to analyze user traffic and engagement activities on Mondays only, so the user associated with the entity may request data from all Mondays in the previous year. The possible combinations of variables specified for analysis may comprise any of: time range, date range, traffic based on identities of specific users, traffic based on personal information of types of users, traffic based on peak usage of engagement activities, and so forth.

In block 404, the electronic layout is displayed on a graphical user interface of a user device, preferably a personal computer. In order for a user associated with an entity to perform analysis of an environment using the electronic layout, it is essential that the user associated with the entity have the capability of interacting with the electronic environment graphically so that they may view any number of scenarios within the environment, visualize bottlenecks of users within the environment, witness improvements and/or changes made to the environment and how said changes impact users, view simulations of the environment on the electronic layout, wherein the simulations model the environment and users in the environment, with proposed changes to the environment implemented, and so forth.

In block 406, the process continues by generating assessment models of electronic layouts comprising user interactions and user traffic. As previously mentioned, the electronic layout may be utilized to evaluate the efficiency of any given environment or engagement activity/engagement device within the environment. In this way, the user interactions within the environment with engagement activities (such as conversing with users associated with the entity, filling out paperwork, etc.) or interactions with engagement devices (such as completing paperwork on an engagement device, completing a transaction on an engagement device, etc.) may be modeled in the system. These models may be shown to users associated with the entity for evaluation, and also be used to prepare the system for categorization of each as being i) optimally efficient, i.e.: not much room for improvement in terms of wait time of the user, throughput rate of the interaction, ii) mediocre efficiency, i.e.: throughput rate, wait time, etc. may be about what is expected by the user and/or entity, or iii) efficiency needs improvement, where longer wait times, slower throughput rate, etc. may be unacceptable to the users in the environment and/or entity.

The system described is capable of identifying areas of the aforementioned efficiency rates, particularly highlighting those where efficiency needs improvement or mediocre efficiency. In this way, areas of improvement for user interaction and user traffic are identified as shown in block 408. The system may highlight to the user associated with the entity particular areas of an environment which seem to be causing longer queue times. Similarly, the system may indicate to a user associate with the entity the areas of the environment which appear to be underutilized. For example, there may be an engagement device which is located in an inconspicuous area, while other similar engagement devices are experiencing a high volume of user interactions (and potentially longer wait times for any user to interact with an engagement device). Similarly, the same analysis can be performed not only for engagement devices, but also engagement activities related to users associated with the entity at the environment in order to evaluate areas of improvement in employee efficiency metrics. For example, one user associated with the entity may have an above-average throughput rate, while another user associated with the entity may have a below-average throughput rate. These indications of employee metrics may be identified graphically in the electronic layout.

In block 410, the electronic layout is improved by applying predictive artificial intelligence with self-learning. While users associated with an entity are presented with areas of improvement for any given environment by the electronic layout, one of the more valuable features of the system is the ability to use predictive artificial intelligence ("AI") along with self-learning. The AI features of the electronic layout system may refer to a machine learning algorithm as part of an artificial intelligence system built using data of a system to make decisions or predictions without the need of being discretely programmed to make decisions or predictions. Machine learning may implement numerous approaches such as supervised learning, unsupervised learning, reinforcement learning, or the like, in order to convert mined data into the machine learning algorithm. Various models for machine learning may be created and implemented, such as artificial neural networks, decision trees, support-vector machines, regression analysis, training models, Bayesian networks, federated learning, or the like.

The system learns and stores data and patterns to increase efficiency of optimization calculations over time (e.g. "identifying areas of improvement"). The machine learning algorithm may be a standalone computer executed code which is implemented before, during, and/or after the system has performed optimization of an electronic layout. The system is configured to learn, using artificial intelligence, the patterns of user flow and user interaction with engagement devices and engagement activities in order to efficiently optimize future environments. For example, the system may have previously determined that the environment is more efficient when engagement activity A is completed before engagement activity B. With AI, the system is able to recognize during the next evaluation of a subsequent environment via an electronic layout that engagement activity A should be completed at a location nearest to an entryway for a user, and engagement activity B should be located nearby engagement activity A. In doing so, calculation time of identifying areas of improvement in block 408 may be reduced. Furthermore, the AI may be self-learning such that it learns entity preferences for optimizing environments, preferences of the entity of users associated with the entity for areas of improvement, and the like, such that future results of the system are tailored towards a user or an entity's preferences for implementation. It shall also be noted that the AI platform stores data such as the previous optimized environments, user inputs, user preferences, prediction algorithms, or the like. In this way, the system comprises a repository of data and information which may be used recursively by the artificial intelligence to create a self-learning mechanism.

Furthermore, the AI components and self-learning allow the system to improve in its prediction capabilities, specifically as it pertains to user engagement activities. As one non-limiting example, as previously described, a user may have started the application (e.g. the completion of forms) for opening an account with the entity when the user was at home. However, the user may have decided that they would prefer to complete the application in the environment in the presence of a user associated with the entity such as an employee. While one may be able to reliably predict that if these two occurrences (starting the application at home and arriving at the environment with an incomplete application) happened within an hour or two of each other, that the purpose of the user's visit to the environment is most likely to complete the application. However, when the time between the two occurrences is increased, the accuracy of the prediction is lowered. Using AI and self-learning, the system is able to reach an average time between occurrences, within a known confidence interval, based on a compilation of historical data. This provides the electronic platform a prediction regarding any particular user's engagement activities when the user enters the environment.

As such, the electronic layout may be able to provide a signal to one or more users associated with the entity at the specific environment to tailor their interactions with the user in a more specific way, such as approaching the user with the in-process application ready for completion, directing the user to another part of the environment, or the like. It shall be noted that this type of predictive artificial intelligence can be applied to any number of engagement activities, engagement devices, or the like. The electronic layout AI functionality uses a feedback loop of past results of predictions to improve future predictions by continuously adjusting itself based on outputs from the electronic layout in order to predict more accurately, implement changes to prediction variables based on whether the entity chose to implement the improvement or not, and so forth. In this way, the electronic layout usefulness to the entity continuously improves over time and becomes tailored to the entity's preferences.

Furthermore, artificial intelligence may be leveraged to provide directed messaging or advertisements to users based on the engagement activities of the user in the environment and/or physical presence in the environment based on the electronic layout. The artificial intelligence may adaptively learn which engagement activities the user is most likely to need to engage in with the entity, and thereafter provide directed messaging and/or advertisements via a user device to the user in order to suggest to the user the products and/or services which the artificial intelligence system finds to be the most useful. The artificial intelligence system may receive and store various data which is a history of the likelihood of success of a message or advertisement by monitoring user activity across an entity, taking into account the activities performed within the environment(s). For example, if a particular advertisement has a high likelihood of conversion to actual activities for users who interacted with one particular engagement device/activity within an environment, the system may recognize this and prioritize the advertisement to a user who has recently interacted with the same engagement device/activity.

As will be appreciated by one of ordinary skill in the art, the present invention may be embodied as an apparatus (including, for example, a system, a machine, a device, a computer program product, and/or the like), as a method (including, for example, a business process, a computer-implemented process, and/or the like), or as any combination of the foregoing. Accordingly, embodiments of the present invention may take the form of an entirely software embodiment (including firmware, resident software, micro-code, and the like), an entirely hardware embodiment, or an embodiment combining software and hardware aspects that may generally be referred to herein as a "system." Furthermore, embodiments of the present invention may take the form of a computer program product that includes a computer-readable storage medium having computer-executable program code portions stored therein. As used herein, a processor may be "configured to" perform a certain function in a variety of ways, including, for example, by having one or more general-purpose circuits perform the functions by executing one or more computer-executable program code portions embodied in a computer-readable medium, and/or having one or more application-specific circuits perform the function.

It will be understood that any suitable computer-readable medium may be utilized. The computer-readable medium may include, but is not limited to, a non-transitory computer-readable medium, such as a tangible electronic, magnetic, optical, infrared, electromagnetic, and/or semiconductor system, apparatus, and/or device. For example, in some embodiments, the non-transitory computer-readable medium includes a tangible medium such as a portable computer diskette, a hard disk, a random access memory (RAM), a read-only memory (ROM), an erasable program-mable read-only memory (EPROM or Flash memory), a compact disc read-only memory (CD-ROM), and/or some other tangible optical and/or magnetic storage device. In other embodiments of the present invention, however, the computer-readable medium may be transitory, such as a propagation signal including computer-executable program code portions embodied therein.

It will also be understood that one or more computer-executable program code portions for carrying out operations of the present invention may include object-oriented, scripted, and/or unscripted programming languages, such as, for example, Java, Perl, Smalltalk, C++, SAS, SQL, Python, Objective C, and/or the like. In some embodiments, the one or more computer-executable program code portions for carrying out operations of embodiments of the present invention are written in conventional procedural program-ming languages, such as the "C" programming languages and/or similar programming languages. The computer pro-gram code may alternatively or additionally be written in one or more multi-paradigm programming languages, such as, for example, F #.

It will further be understood that some embodiments of the present invention are described herein with reference to data flowchart illustrations and/or block diagrams of sys-tems, methods, and/or computer program products. It will be understood that each block included in the data flowchart illustrations and/or block diagrams, and combinations of blocks included in the data flowchart illustrations and/or block diagrams, may be implemented by one or more computer-executable program code portions. These one or more computer-executable program code portions may be provided to a processor of a general purpose computer, special purpose computer, and/or some other programmable data processing apparatus in order to produce a particular machine, such that the one or more computer-executable program code portions, which execute via the processor of the computer and/or other programmable data processing apparatus, create mechanisms for implementing the steps and/or functions represented by the data flowchart(s) and/or block diagram block(s).

It will also be understood that the one or more computer-executable program code portions may be stored in a tran-sitory or non-transitory computer-readable medium (e.g., a memory, and the like) that can direct a computer and/or other programmable data processing apparatus to function in a particular manner, such that the computer-executable pro-gram code portions stored in the computer-readable medium produce an article of manufacture, including instruction mechanisms which implement the steps and/or functions specified in the data flowchart(s) and/or block diagram block(s).

The one or more computer-executable program code portions may also be loaded onto a computer and/or other programmable data processing apparatus to cause a series of operational steps to be performed on the computer and/or other programmable apparatus. In some embodiments, this produces a computer-implemented process such that the one or more computer-executable program code portions which execute on the computer and/or other programmable appa-ratus provide operational steps to implement the steps speci-fied in the data flowchart(s) and/or the functions specified in the block diagram block(s). Alternatively, computer-imple-mented steps may be combined with operator and/or human-implemented steps in order to carry out an embodiment of the present invention.

While certain exemplary embodiments have been described and shown in the accompanying drawings, it is to be understood that such embodiments are merely illustrative of, and not restrictive on, the broad invention, and that this invention not be limited to the specific constructions and arrangements shown and described, since various other changes, combinations, omissions, modifications and sub-stitutions, in addition to those set forth in the above para-graphs, are possible. Those skilled in the art will appreciate that various adaptations and modifications of the just described embodiments can be configured without departing from the scope and spirit of the invention. Therefore, it is to be understood that, within the scope of the appended claims, the invention may be practiced other than as specifically described herein.

What is claimed is:

1. A system for electronic duplication and simulation of environments via a hardware device network, the system comprising:

a memory device with computer-readable program code stored thereon;

a communication device;

a processing device operatively coupled to the memory device and the communication device, wherein the processing device is configured to execute the computer-readable program code to:

receive, as an input, a layout of an environment, wherein the layout of the environment comprises at least one of walls, objects, or boundaries;

generate an electronic layout, wherein the electronic layout comprises electronic data of the environment stored in the memory device, and wherein the electronic layout comprises a graphical representation of the environment;

identify on the electronic layout the location of at least one engagement device and at least one engagement activity, wherein the at least one engagement device and the at least one engagement activity comprise throughput rates;

identify on the electronic layout at least one location of entryways or off-limit areas, wherein the entryways are monitored for the flow of users through the entryways by receiving location data from user devices, and wherein an exclusion rule is applied such that the off-limit areas are designated to not be monitored or stored;

display the electronic layout on a graphical user interface of a user device, wherein the electronic layout comprises both two-dimensional and three-dimensional renderings selectable at the graphical user interface;

identify user devices within the environment, wherein the user devices are co-located with users, and the location of the users is identified using location data provided from the user devices;

identify the users associated with the user devices within the environment by receiving user device data, wherein each of the user device data matches a user with an account associated with the user;

obtain a link between the electronic layout and the users in the environment, wherein the link establishes ongoing communication of location of the users such user movement is monitored;

continuously monitor the user movement and the engagement activities of the users in the environment, wherein the locations and the engagement activities are continuously communicated via the link;

transmit the user movement and the engagement activities of the users in the environment to the electronic layout, wherein the user movement and the engagement activities of the users are represented graphically in the electronic layout;

receive from the memory device the electronic layout, wherein the electronic layout comprises identification of the users, locations of the users, and engagement activities of the users;

generate assessment models of electronic layouts comprising user interactions and user traffic;

display the assessment models on the graphical user interface of the user device;

identify areas of improvement for user interactions and user traffic; and improve the electronic layout by implementing predictive artificial intelligence, wherein the predictive artificial intelligence predicts a reason for visiting the environment for the users, wherein the electronic layout is configured for later retrieval and replay of the user movement and the engagement activities from a prior time period.

2. The system of claim 1, wherein the improving the electronic layout by implementing the predictive artificial intelligence further comprises self-learning, wherein self-learning improves future predictions by continuously adjusting the predictive artificial intelligence based on outputs from the electronic layout.

3. The system of claim 1, wherein the location data provided from the user devices comprises global positioning system data received from an application on the user device, wherein the application is configured to notify the entity system when the user device is within the environment, and the entity system thereafter receives more detailed or more frequent geographic coordinate or positioning information.

4. The system of claim 1, wherein the processing device is further configured to execute the computer-readable program code to:

identify the users interacting with IoT devices within the environment by receiving data from the IoT devices.

5. The system of claim 1, wherein the electronic layout received from the memory device is an electronic layout from a prior time period, wherein the engagement activities of the users are monitored on the graphical user interface of the user device for the prior time period.

6. A computer program product for electronic duplication and simulation of environments via a hardware device network, the computer program product comprising at least one non-transitory computer-readable medium having computer-readable program code portions embodied therein, the computer-readable program code portions comprising:

receiving, as an input, a layout of an environment, wherein the layout of the environment comprises at least one of walls, objects, or boundaries;

generating an electronic layout, wherein the electronic layout comprises electronic data of the environment stored in the memory device, and wherein the electronic layout comprises a graphical representation of the environment;

identifying on the electronic layout the location of at least one engagement device and at least one engagement activity, wherein the at least one engagement device and the at least one engagement activity comprise throughput rates;

identifying on the electronic layout at least one location of entryways or off-limit areas, wherein the entryways are monitored for the flow of users through the entryways by receiving location data from user devices, and wherein an exclusion rule is applied such that the off-limit areas are designated to not be monitored or stored;

displaying the electronic layout on a graphical user interface of a user device, wherein the electronic layout comprises both two-dimensional and three-dimensional renderings selectable at the graphical user interface;

identifying user devices within the environment, wherein the user devices are co-located with users, and the location of the users is identified using location data provided from the user devices;

identifying the users associated with the user devices within the environment by receiving user device data, wherein each of the user device data matches a user with an account associated with the user;

obtaining a link between the electronic layout and the users in the environment, wherein the link establishes ongoing communication of location of the users such user movement is monitored;

continuously monitoring the user movement and the engagement activities of the users in the environment, wherein the locations and the engagement activities are continuously communicated via the link;

transmitting the user movement and the engagement activities of the users in the environment to the electronic layout, wherein the user movement and the engagement activities of the users are represented graphically in the electronic layout;

receiving from the memory device the electronic layout, wherein the electronic layout comprises identification of the users, locations of the users, and engagement activities of the users;

generating assessment models of electronic layouts comprising user interactions and user traffic;

displaying the assessment models on the graphical user interface of the user device;

identifying areas of improvement for user interactions and user traffic; and improving the electronic layout by implementing predictive artificial intelligence, wherein the predictive artificial intelligence predicts a reason for visiting the environment for the users, wherein the electronic layout is configured for later retrieval and replay of the user movement and the engagement activities from a prior time period.

7. The computer program product of claim 6, wherein the improving the electronic layout by implementing the predictive artificial intelligence further comprises self-learning, wherein self-learning improves future predictions by continuously adjusting the predictive artificial intelligence based on outputs from the electronic layout.

8. The computer program product of claim 6, wherein the location data provided from the user devices comprises global positioning system data received from an application on the user device, wherein the application is configured to notify the entity system when the user device is within the environment, and the entity system thereafter receives more detailed or more frequent geographic coordinate or positioning information.

9. The computer program product of claim 6, wherein the computer-readable code portion further comprises:

identifying the users interacting with IoT devices within the environment by receiving data from the IoT devices.

10. The computer program product of claim 6, wherein the electronic layout received from the memory device is an electronic layout from a prior time period, wherein the engagement activities of the users are monitored on the graphical user interface of the user device for the prior time period.

11. A computer-implemented method for electronic duplication and simulation of environments via a hardware device network, the computer-implemented method comprising:

providing a computing system comprising a computer processing device and a non-transitory computer readable medium, where the non-transitory computer readable medium comprises configured computer program instruction code, such that when said computer program instruction code is operated by said computer processing device, said computer processing device performs the following operations:

receiving, as an input, a layout of an environment, wherein the layout of the environment comprises at least one of walls, objects, or boundaries;

generating an electronic layout, wherein the electronic layout comprises electronic data of the environment stored in the memory device, and wherein the electronic layout comprises a graphical representation of the environment;

identifying on the electronic layout the location of at least one engagement device and at least one engagement activity, wherein the at least one engagement device and the at least one engagement activity comprise throughput rates;

identifying on the electronic layout at least one location of entryways or off-limit areas, wherein the entryways are monitored for the flow of users through the entryways by receiving location data from user devices, and wherein an exclusion rule is applied such that the off-limit areas are designated to not be monitored or stored;

displaying the electronic layout on a graphical user interface of a user device, wherein the electronic layout comprises both two-dimensional and three-dimensional renderings selectable at the graphical user interface;

identifying user devices within the environment, wherein the user devices are co-located with users, and the location of the users is identified using location data provided from the user devices;

identifying the users associated with the user devices within the environment by receiving user device data, wherein each of the user device data matches a user with an account associated with the user;

obtaining a link between the electronic layout and the users in the environment, wherein the link establishes ongoing communication of location of the users such user movement is monitored;

continuously monitoring the user movement and the engagement activities of the users in the environment, wherein the locations and the engagement activities are continuously communicated via the link;

transmitting the user movement and the engagement activities of the users in the environment to the electronic layout, wherein the user movement and the engagement activities of the users are represented graphically in the electronic layout;

receiving from the memory device the electronic layout, wherein the electronic layout comprises identification of the users, locations of the users, and engagement activities of the users;

generating assessment models of electronic layouts comprising user interactions and user traffic;

displaying the assessment models on the graphical user interface of the user device;

identifying areas of improvement for user interactions and user traffic; and improving the electronic layout by implementing predictive artificial intelligence, wherein the predictive artificial intelligence predicts a reason for visiting the environment for the users, wherein the electronic layout is configured for later
retrieval and replay of the user movement and the
engagement activities from a prior time period.

12. The computer-implemented method of claim 11,
wherein the improving the electronic layout by implementing the predictive artificial intelligence further comprises
self-learning, wherein self-learning improves future predic-
tions by continuously adjusting the predictive artificial intel-
ligence based on outputs from the electronic layout.

13. The computer-implemented method of claim 11, wherein the location data provided from the user devices
comprises global positioning system data received from an
application on the user device, wherein the application is
configured to notify the entity system when the user device
is within the environment, and the entity system thereafter
receives more detailed or more frequent geographic coordi-
nate or positioning information.

14. The computer-implemented method of claim 11,
wherein the method further comprises:

identifying the users interacting with IoT devices within
the environment by receiving data from the IoT
devices.

<div style="text-align:center">* * * * *</div>